US012242076B2

United States Patent
Pilard et al.

(10) Patent No.: US 12,242,076 B2
(45) Date of Patent: Mar. 4, 2025

(54) LIGHT-EMITTING DEVICE AND METHOD FOR EMITTING LIGHT

(71) Applicant: Robert Bosch GmbH, Stuttgart (DE)

(72) Inventors: Gael Pilard, Wankheim (DE); Hendrik Specht, Pliezhausen (DE); Martin Edel, Stuttgart-Vaihingen (DE); Sebastian Reiss, Reutlingen (DE); Simon Pick, Tuebingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 799 days.

(21) Appl. No.: 17/293,286

(22) PCT Filed: Feb. 18, 2020

(86) PCT No.: PCT/EP2020/054273
§ 371 (c)(1),
(2) Date: May 12, 2021

(87) PCT Pub. No.: WO2020/193014
PCT Pub. Date: Oct. 1, 2020

(65) Prior Publication Data
US 2022/0013975 A1   Jan. 13, 2022

(30) Foreign Application Priority Data
Mar. 25, 2019   (DE) .......................... 102019204019.5

(51) Int. Cl.
*H01S 5/40*   (2006.01)
*G02B 27/09*   (2006.01)
(Continued)

(52) U.S. Cl.
CPC ........ *G02B 27/0911* (2013.01); *G02B 27/141* (2013.01); *H01S 3/0085* (2013.01);
(Continued)

(58) Field of Classification Search
CPC ............................ H01S 5/4012; H01S 5/4093
See application file for complete search history.

(56) References Cited

U.S. PATENT DOCUMENTS 5,212,710 A    5/1993 Kaneda et al.
5,258,989 A *  11/1993 Raven .................... H01S 3/005
                                              372/100

(Continued)

FOREIGN PATENT DOCUMENTS

CN    101689006 A    3/2010
CN    102789055 A    11/2012
(Continued)

OTHER PUBLICATIONS

International Search Report for PCT/EP2020/054273, Issued Jun. 12, 2020.

*Primary Examiner* — Michael Carter
(74) *Attorney, Agent, or Firm* — NORTON ROSE FULBRIGHT US LLP; Gerard A. Messina (57) ABSTRACT

A light-emitting device, having a laser light device that is designed to emit a multiplicity of laser light beams. Ellipticities of beam cross-sections of the laser light beams differ at least partly from one another. The light-emitting device includes a beamforming device that is introduced into the beam path of at least one of the laser light beams and that is designed to adapt the ellipticities of the beam cross-sections of the laser light beams to one another, and a beam-combining device that is designed to combine the laser light beams to form an overall light beam, after the adapting of the ellipticities of the beam cross-sections by the beamforming device.

9 Claims, 6 Drawing Sheets

(51) Int. Cl.
*G02B 27/14* (2006.01)
*H01S 3/00* (2006.01)
*H01S 5/00* (2006.01)

(52) U.S. Cl.
CPC ............ *H01S 5/4012* (2013.01); *H01S 5/005* (2013.01); *H01S 5/4093* (2013.01)

(56) References Cited

U.S. PATENT DOCUMENTS

| | | | |
|---|---|---|---|
| 9,124,061 B2 * | 9/2015 | Essaian | G02B 27/48 |
| 2009/0323027 A1 | 12/2009 | Uchikawa | |
| 2011/0037953 A1 * | 2/2011 | Nizani | G02B 3/005 |
| | | | 353/38 |
| 2012/0293775 A1 * | 11/2012 | Kita | G02B 26/105 |
| | | | 353/38 |
| 2014/0078473 A1 | 3/2014 | Kusaka et al. | |
| 2018/0017769 A1 | 1/2018 | Meng et al. | |

FOREIGN PATENT DOCUMENTS

| | | |
|---|---|---|
| CN | 104155832 A | 11/2014 |
| CN | 108333787 A | 7/2018 |
| DE | 102013216896 A1 | 2/2015 |
| EP | 3226064 A1 | 10/2017 |
| EP | 3226065 A1 | 10/2017 |
| EP | 3267536 A1 | 1/2018 |
| JP | 2010032797 A | 2/2010 |
| WO | 2013178280 A1 | 12/2013 |

* cited by examiner

LIGHT-EMITTING DEVICE AND METHOD FOR EMITTING LIGHT

FIELD

The present invention relates to a light-emitting device, in particular a light-emitting device for use with micromirrors, for example for use in projectors, scanners, or sensor systems. In addition, the present invention relates to a method for emitting light.

BACKGROUND INFORMATION

Light-emitting devices, in which a plurality of laser light beams are combined to form an overall light beam, are known for example as RGB modules, and are suitable in particular for use in projectors, (barcode) scanners, or sensor devices. Particularly advantageously, such light-emitting devices can be combined with micromirrors, creating the possibility of precisely deflecting laser light beams; here, despite a very compact design, a high light intensity and a good resolution can nonetheless be achieved.

The emitted laser light beams typically have, in particular given the use of edge emitters, an asymmetrical beam profile, such that the beam cross-section can be described by an ellipse, to a good approximation. The divergence is greater in one direction, i.e., along the fast axis or major axis, than along a direction perpendicular thereto, i.e., along the slow axis, or minor axis. The laser light beams can be described as a Gauss beam, and for multimode lasers m-squared factors can be taken into account if appropriate.

European Patent No. EP 3226064 B1 describes that two light sources emit light having the same wavelength, the light sources being configured such that the beam profiles differ from one another by an angle of rotation. A beam rotating element is designed to rotate at least one of the beam profiles in such a way that the major axes of the beam profiles run parallel to one another. In this way, it can be achieved that the beam profile is modified independent of the polarization, so that in the combination a widening of the beam profile or a reduction of the beam intensity can be reduced.

In addition, German Patent Application No. DE 10 2013 216896 A1 describes a light source device in which two red light sources are provided whose wavelengths differ from one another, thus achieving a reduction of the speckle effect.

SUMMARY

The present invention provides a light-emitting device and a method for imaging light.

Preferred specific embodiments of the present invention are disclosed herein.

According to a first aspect, the present invention accordingly relates to a light-emitting device having a laser light device that is designed to emit a multiplicity of laser light beams. In accordance with an example embodiment of the present invention, ellipticities of beam cross-sections of the laser light beams differ at least partly from one another. The light-emitting device further includes a beamforming device that is introduced into the beam path of at least one of the laser light beams and that is designed to adapt the ellipticities of the beam cross-sections of the laser light beams to one another. In addition, the light-emitting device includes a beam-combining device that, after the adapting of the ellipticities of the beam cross-sections by the beamforming device, combines the laser light beams to form an overall light beam.

According to a second aspect, the present invention accordingly relates to a method for emitting light, a multiplicity of laser light beams being emitted. In accordance with an example embodiment of the present invention, the ellipticities of beam cross-sections of the laser light beams here differ at least partly from one another. The ellipticities of the beam cross-sections of the laser light beams are adapted to one another. After the adapting of the ellipticities of the beam cross-sections, the laser light beams are combined to form an overall light beam.

SUMMARY

In accordance with the present invention, it is taken into account, in the combination of laser light beams, that the ellipticities of beam cross-sections of laser light beams have different wavelengths differ from one another. In the context of the present invention, ellipticity is to be understood as the variable also referred to as "degree of ellipticity," which is given by the ratio of the length of the major axis to the length of the minor axis, and is typically between 2 and 4, as a function of the wavelengths. In general, an elliptical beam cross-section can also be described by one of the other parameters that characterize the ellipse shape, for example by the linear eccentricity defined by the distance of the focal points from the midpoint, or by the numerical eccentricity, which results as the ratio of the linear eccentricity to the length of the major axis. The goal of light-imaging devices is typically to emit an overall light beam whose beam cross-section has as small an ellipticity as possible, i.e., is as circular as possible. If the individual laser light beams are first combined to form an overall light beam, and subsequently the ellipticity of the cross-section of the overall light beam is corrected, then in general there results a reduction of the light intensity or a worsened resolution, because such a correction of the different ellipticities of the cross-sections of the individual laser light beams that combine to form the overall light beam is not taken into account. Therefore, according to the present invention it is provided that the ellipticities of the beam cross-sections of the laser light beams are adapted to one another already before the combining of the laser light beams. In general, the beamforming device is designed to form the laser light beams in such a way that the beam cross-sections are substantially identical and have the same orientation, where "the same orientation" is to be understood as meaning that the major axes and minor axes of the elliptical cross-sections of the various laser light beams run parallel to one another. In this way, it is achieved that in the combining of the laser light beams, and given an optional subsequent correction of a remaining ellipticity of the overall light beam, the intensity is not reduced, and at the same time a good resolution can be achieved.

In general, the requirements on the light-emitting device, when used with micromirrors, result from the mirror geometry and the pixel size for a given distance. The resolution of such a system can be determined on the basis of the Rayleigh criterion, so that two points are regarded as distinguishable if the main maximum of the one point coincides with the first minimum of the other point.

According to a preferred development, the light-imaging device has a further beamforming device that is situated in the beam path of the overall light beam, and is designed to correct an ellipticity of the cross-section of the overall light beam. A correction of the ellipticity of the overall light beam can be understood as meaning that the overall light beam resulting after the course correction has a substantially circular cross-section.

According to a preferred development of the light-imaging device in accordance with the present invention, the beamforming device and/or the further beamforming device have at least one cylinder lens and/or a cylinder telescope, whereby the major axis of the elliptical beam cross-section of the corresponding laser light beam, or of the overall light beam, is reduced and adapted to the minor axis. Conversely, the minor axis of the elliptical beam cross-section can be increased and adapted to the major axis. A simultaneous adapting of major axis and minor axis is also possible.

According to a preferred development of the light-emitting device of the present invention, the beamforming device and/or the further beamforming device have a prism telescope for correcting the ellipticity of the overall light beam. The prism telescope can have a multiplicity of prisms, in particular a pair of prisms. The prism telescope is designed to reduce the major axis of the elliptical beam cross-section and/or to enlarge the minor axis of the elliptical beam cross-section, and thus to adapt the major axis and minor axis.

The portions of different wavelengths in the overall light beam have angles of emission that differ slightly from one another. For the correction, an achromatic amorphous prism pair can be used. According to a further specific embodiment of the present invention that is lower in cost, the laser light beams are collimated directly after emission, using collimation lenses. Through fine adjustment of the orientation of the collimation lenses in a plane perpendicular to the direction of emission of the laser light beams, it can be achieved that the laser light beams impinge on the beamforming device already with slightly different angles of incidence, so that the deviation, caused by the wavelength, of the angles of emission can just be compensated. The collimation lenses are thus configured with a different offset relative to the direction of emission of the corresponding laser light beam for different wavelengths of the laser light beams.

According to a preferred development of the light-emitting device of the present invention, the beamforming device is designed to adapt the ellipticities in such a way that after the adapting the ellipticities of the laser light beams are each in a specified range, in particular between 1.5 and 2.5. In particular, in this way even after the adapting of the ellipticities, a certain degree of difference of the ellipticities can be permitted. According to further specific embodiment, the degree of the deviation can be specified. Thus, the beamforming device can be designed such that the ellipticities of the beam cross-sections of the laser light beams differ from a mean value of the ellipticities by at most a specified percent, for example by 5 percent, 10 percent, or 20 percent.

According to a preferred development of the light-emitting device of the present invention, the beamforming device is designed to adapt the ellipticities in such a way that the ellipticities of the beam cross-sections of the laser light beams assume the same value after the adapting.

According to a preferred development of the light-emitting device of the present invention, the beamforming device is designed to adapt the ellipticities of the beam cross-sections of the laser light beams to the ellipticity of the beam cross-section of one of the laser light beams. In particular, it can be provided that only the ellipticities of a subset of the multiplicity of laser light beams are adapted.

According to a preferred development of the light-emitting device of the present invention, the laser light device has a multiplicity of laser light sources that are designed to emit laser light beams having wavelengths that differ at least partly from one another. In particular, the laser light sources can emit laser light beams having wavelengths in the red and/or green and/or blue spectral region.

According to a preferred development of the light-emitting device of the present invention, the beam-combining device has wavelength-selective mirrors for combining the laser light beams to form a common light beam. These can be understood as including in particular dielectric or dichroic mirrors that reflect laser light beams from a particular spectral region and transmit laser light beams from other spectral regions, so that the laser light beams are superposed to form the overall light beam without further influencing the optical properties of the laser light beams beyond this.

DETAILED DESCRIPTION OF EXAMPLE EMBODIMENTS

Figure 1:
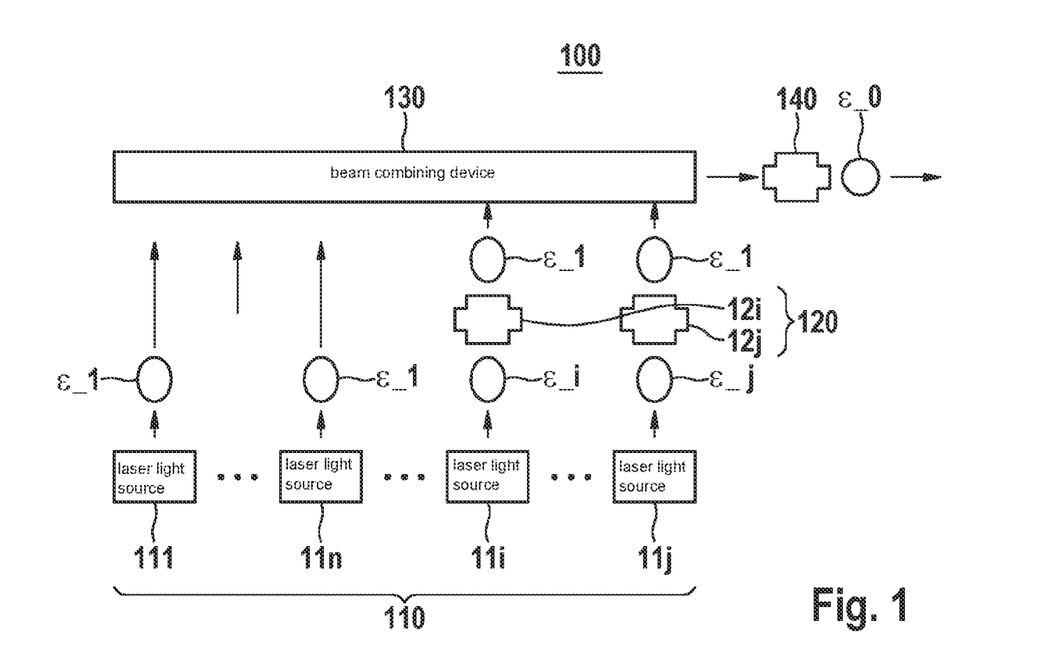
FIG. 1 shows a schematic cross-sectional view of a light-emitting device according to a first specific embodiment of the present invention.

FIG. 1 shows a schematic representation of a light-emitting device 100. Light-emitting device 100 has a laser light device 110 that has at least one first laser light source 111 to 11$n$ that emits a laser light beam whose beam cross-section has a first ellipticity $\varepsilon\_1$. The first ellipticity can for example be approximately 2.0, and more generally can be in the range $1.5<\varepsilon\_1<2.5$. In particular, the at least one first laser light source 111 to 11$n$ can emit laser light beams in the red wavelength range. Laser light device 110 has at least one further laser light source 11$i$ to 11$j$, which emits a laser light beam whose beam cross-section has an ellipticity $\varepsilon\_1$ to $\varepsilon\_j$ differing from first ellipticity $\varepsilon\_1$. In particular, a second ellipticity $\varepsilon\_2$ can be approximately 3.5, and more generally can be in the range $2.5<\varepsilon\_2<4.5$. Ellipticities $\varepsilon\_1$ to $\varepsilon\_j$ of laser light sources 111 to 11$j$ can be partly identical. Laser light sources 111 to 11j can preferably be laser diodes, in particular edge emitters. Preferably, light-emitting device 100 has at least three laser light sources 111 to 11j.

Light-emitting device 100 further includes a beamforming device 120 that is introduced into the beam path of at least one of the laser light beams. Beamforming device 120 can have beamforming elements 12i to 12j, each of which is introduced into a beam path of a laser light beam. It is also possible to introduce no beamforming element into the beam paths of any of the laser light beams. Thus, for example the laser light beams of the at least one first laser light source 111 to 11n can be free of any influence from beamforming device 120, while the laser light beams emitted by the further laser light sources 11i to 11j are shaped by the respectively allocated beamforming elements 12i to 12j in such a way that the ellipticities $\varepsilon\_1$ to $\varepsilon\_j$ of the respective beam cross-sections, after passing through beamforming device 120, correspond to first ellipticity $\varepsilon\_1$, which preferably assumes the smallest value of the ellipticities $\varepsilon\_1$, $\varepsilon\_i$ to $\varepsilon\_j$. Beamforming elements 12i to 12j preferably include cylinder lenses, but can also be realized by prism pairs or by any other optical elements for modifying the ellipticity. Beamforming elements 12i to 12j can be designed to reduce the major axis of the elliptical beam cross-section and/or to enlarge the minor axis of the elliptical beam cross-section.

In addition, light-emitting device 100 has a beam-combining device 130 that combines the laser light beams to form an overall light beam. For this purpose, beam-combining device 130 can include wavelength-selective mirrors, in particular dielectric or dichroic mirrors. In addition, a further beamforming device 140 can be situated in the beam path of the overall light beam, which device corrects the ellipticity of the beam cross-section of the overall light beam so that the beam cross-section of the overall light beam has a zeroth ellipticity $\varepsilon\_0$, whose value is for example approximately 1.0, and more generally can be in the range $0.6 < \varepsilon\_0 < 1.4$. The overall light beam thus has a beam cross-section that is as circular as possible. For example, first ellipticity $\varepsilon\_1$ can be corrected, with a beamforming factor of 1.9, and second ellipticity $\varepsilon\_2$ can be corrected, with an overall beamforming factor of 3.2, to the zeroth ellipticity $\varepsilon\_0$. Beamforming device 120 can be set to provide a beamforming factor of 1.9, while further beamforming device 140 provides a beamforming factor of $3.2/1.9 = 1.7$. In addition, light-emitting device 100 can have at least one micromirror that is designed to deflect the possibly corrected overall light beam.

Figure 2:
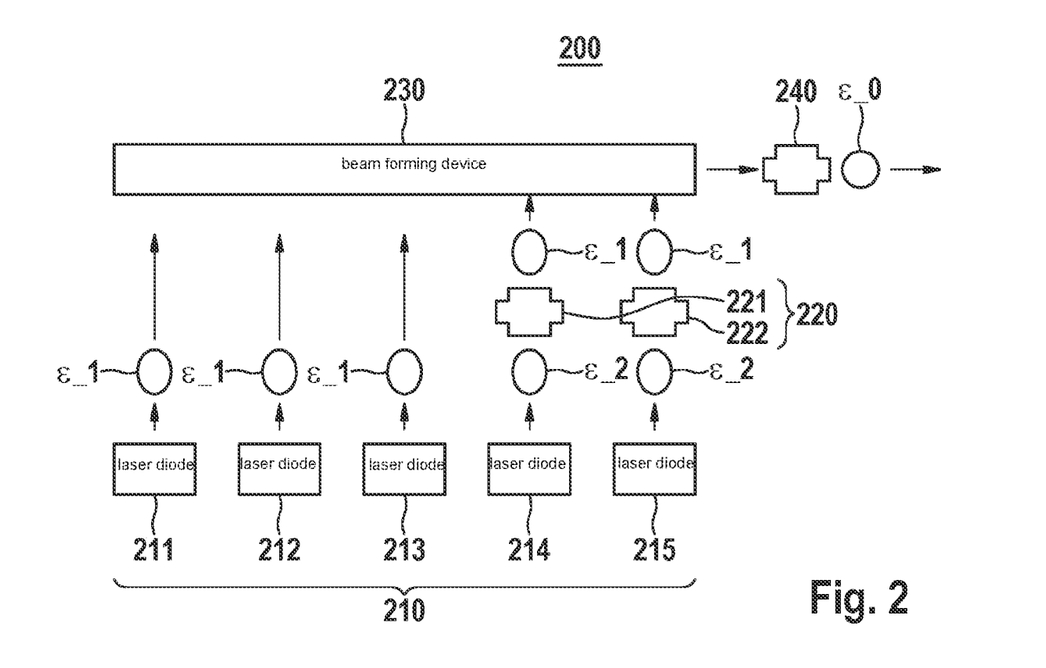
FIG. 2 shows a schematic cross-sectional view of a light-emitting device according to a second specific embodiment of the present invention.

FIG. 2 shows a schematic representation of a further light-emitting device 200, having a laser light device 210 that has five laser diodes 211 to 215, first through third laser diodes 211 to 213 emitting laser light beams whose beam cross-section has a first ellipticity $\varepsilon\_1$, while fourth and fifth laser diodes 214, 215 emit laser light beams whose beam cross-section has a second ellipticity $\varepsilon\_2$. A beamforming device 220 includes a first beamforming element 221 and a second beamforming element 222 that are introduced into the beam path of the laser light beam emitted by fourth laser diode 214, or of the laser light beam emitted by fifth laser diode 215, and that adapt second ellipticity $\varepsilon\_2$ of the beam cross-sections to first ellipticity $\varepsilon\_1$.

After the combining of the adapted laser light beams by a beamforming device 230 as described above, an overall light beam produced thereby is corrected, using a further beamforming device 240 as described above, in such a way that the ellipticity of the beam cross-section of the corrected overall light beam corresponds to the zeroth ellipticity $\varepsilon\_0$.

Figure 3:
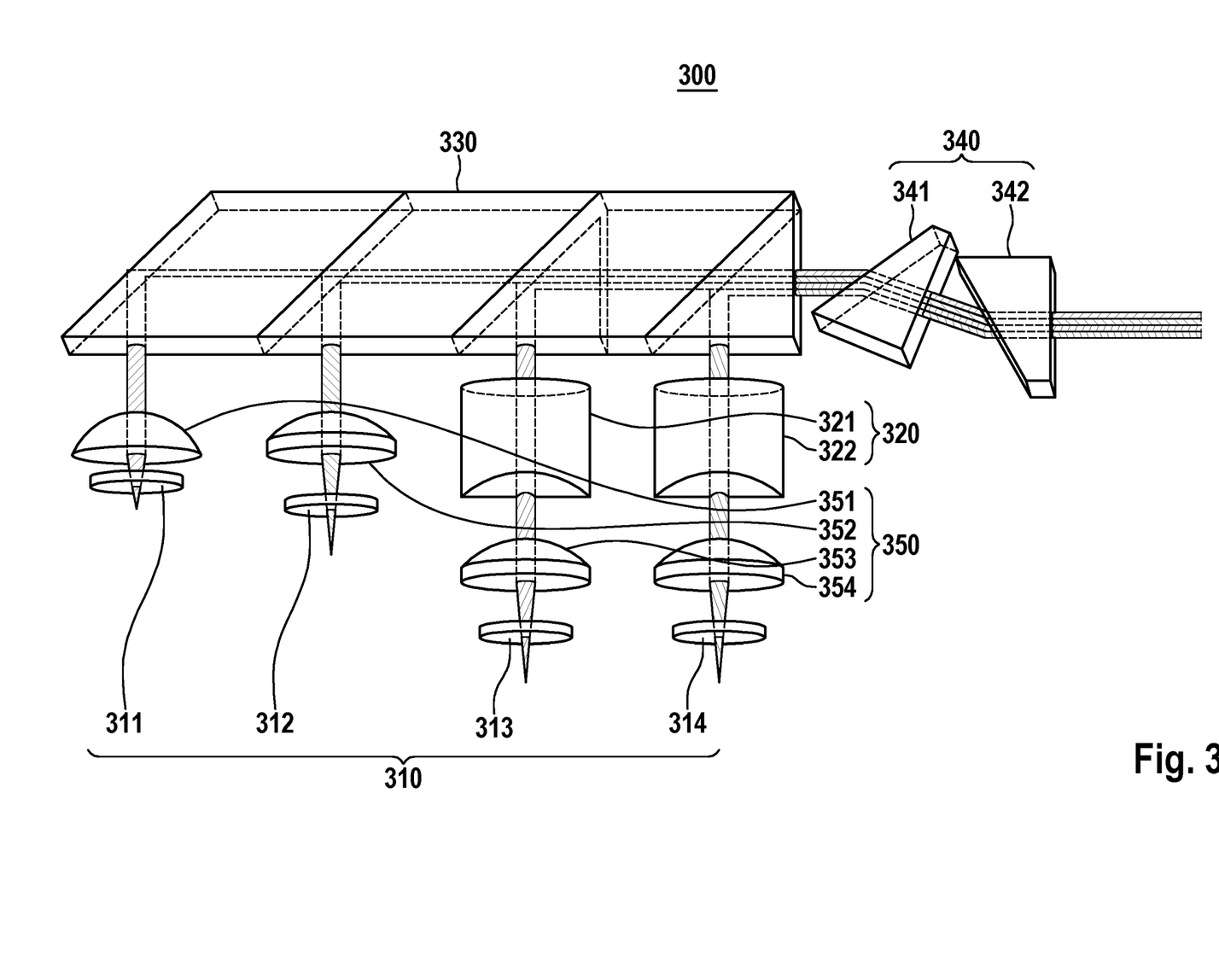
FIG. 3 shows a schematic cross-sectional view of a light-emitting device according to a third specific embodiment of the present invention.

FIG. 3 shows a schematic cross-sectional view of a light-emitting device 300 that has a laser light device 310 having first through fourth laser diodes 311 to three and 14, first laser diode 311 emitting a laser light beam in the infrared range, second laser diode 312 emitting a laser light beam in the red wavelength range, third laser diode 313 admitting a laser light beam in the green wavelength range, and fourth laser diode 314 emitting a laser light beam in the blue wavelength range. The ellipticity of the beam cross-section for red light is typically 2.0, for green light is typically 3.5, and for blue light is typically 4.0. The emitted laser light beams are collimated by aspherical collimation lenses 351 to 354, each situated in the beam path of the laser light beams, of a collimation device 350. The laser light beam emitted by third laser diode 313 and the laser light beam emitted by fourth laser diode 314 are formed by respective beamforming elements 321, 322 of a beamforming device 320 of light-emitting device 300 in such a way that the ellipticities of the beam cross-sections of these laser light beams are adapted to the ellipticities of the beam cross-sections of the laser light beams emitted by first laser diode 311 and by second laser diode 312. In particular, through suitable selection of beamforming elements 321, 322, it can be achieved that the ellipticities all lie in a specified range, and for example deviate from a mean value by only a specified percentage. The adapted laser light beams are combined by a beam-combining device 330 that includes wavelength-selective mirrors, to form an overall light beam. A further beamforming device 340 includes a prism pair 341, 342, whereby a remaining ellipticity is corrected, i.e., a substantially more circular beam cross-section of the overall light beam is achieved. In order to correct a wavelength-dependent angle of emission, collimation lenses 351 to 354 can be offset in a plane perpendicular to the direction of emission of the laser light beams.

If the major axis is reduced by beamforming device 320, the focal lengths of collimation lenses 353 to 354 are correspondingly adapted relative to a scenario without beamforming device 320; i.e., if, without beamforming device 320, a focal length $f\_a$ is required for a particular wavelength, and the beam width is reduced by beamforming device 320 by a factor M, then the focal lengths of collimation lenses 353 to 354 have to be set $f\_b = f\_a * M$. The focal length is larger as a result, so that possible undesired overlapping with further components can be avoided.

Figure 4:
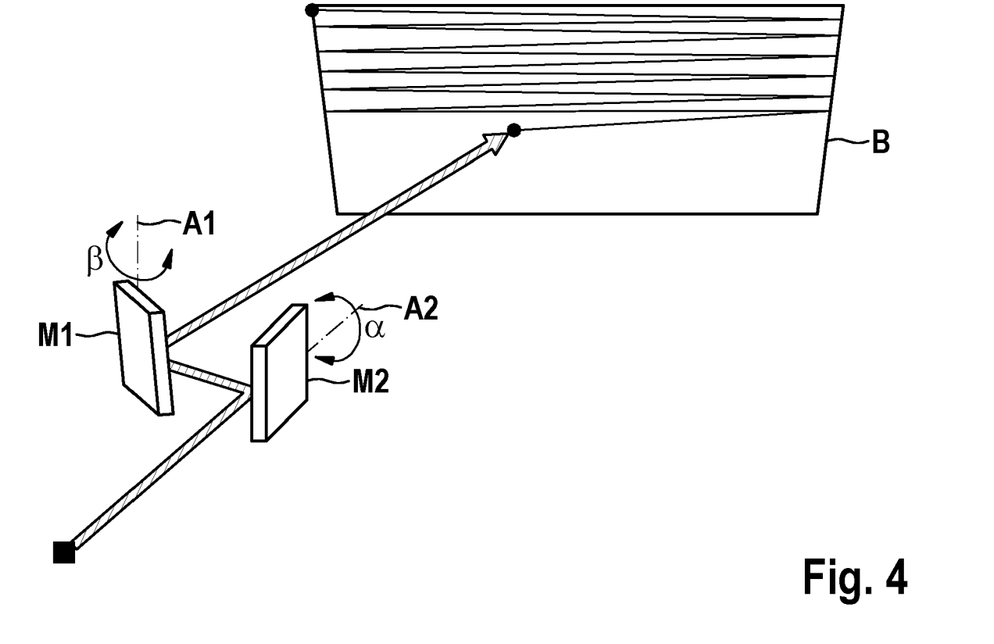
FIG. 4 shows a schematic representation of a micromirror system as part of a light-emitting device according to the present invention.

FIG. 4 shows a micromirror pair M1, M2 that can be part of the above-illustrated light-emitting devices 100 to 300. Micromirrors M1, M2 are deflectable by a first angle $\alpha$ or, respectively, by a second angle $\beta$, about a first axis A1 or a second axis A2 that stand perpendicular to one another. Through deflection of micromirrors M1, M2, a pattern on a screen B can be scanned, a micromirror M1 being deflected with a higher frequency than second micromirror M2. Instead of a micromirror pair, light-emitting device 100 to 300 can also have a micromirror that is deflectable about two axes.

Figure 5:
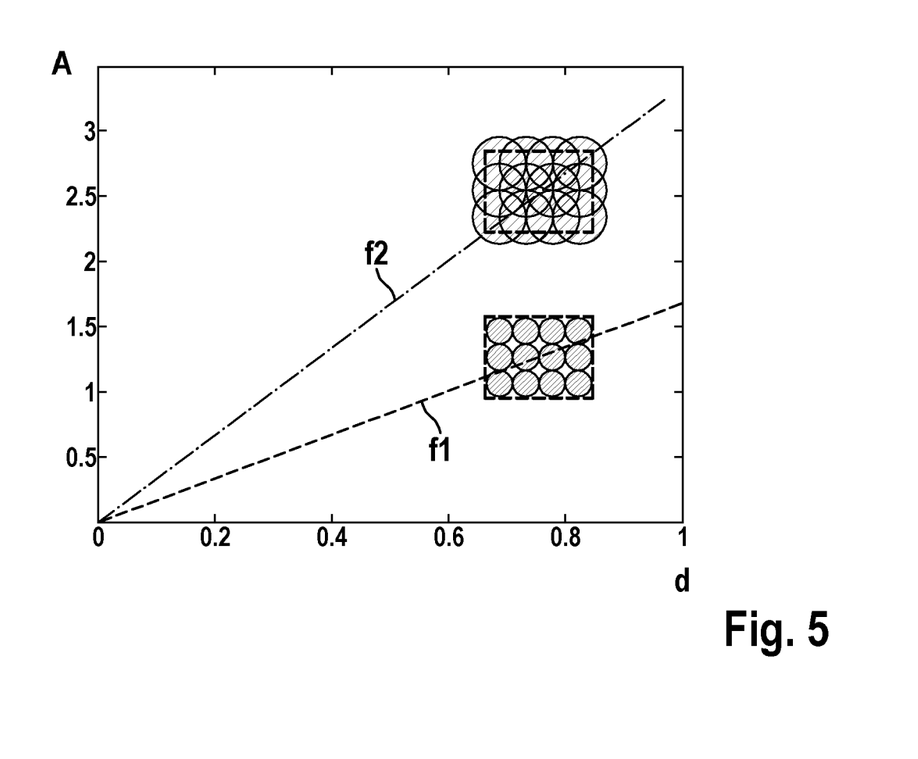
FIG. 5 shows an illustration of the resolution as a function of the aperture of a micromirror and of a projection distance from the micromirror.

FIG. 5 illustrates the possible resolution as a function of the aperture A of a micromirror M1, M2 (or, in the case of a plurality of micromirrors M1, M2, of the smallest micromirror M1, M2) and of the distance d of screen B from micromirrors M1, M2. A lower bound is given by a first function f1, in which adjacent pixels border one another directly. Given a greater distance between the pixels, the light intensity is reduced. A pixel can be defined in that the intensity is reduced to a value $1/e^2$. An upper bound is given by a second function f2, in which the pixels are twice as large. Given a still smaller distance of adjacent pixels, the possible resolution is reduced.

Figure 6:
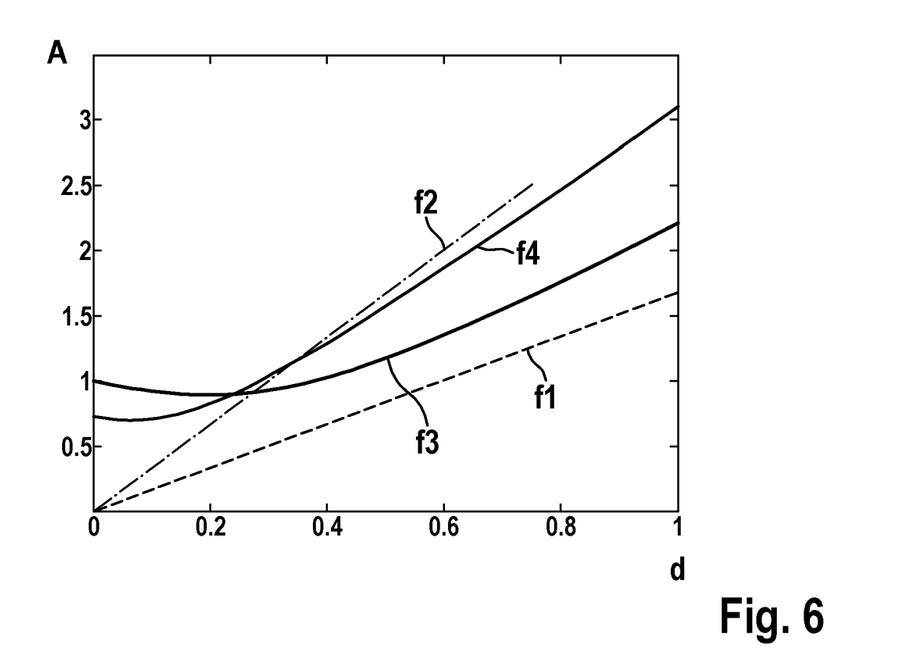
FIG. 6 shows a schematic illustration of the divergence with regard to the fast axis for red light, given the use of a light-emitting device according to the present invention.
Figure 7:
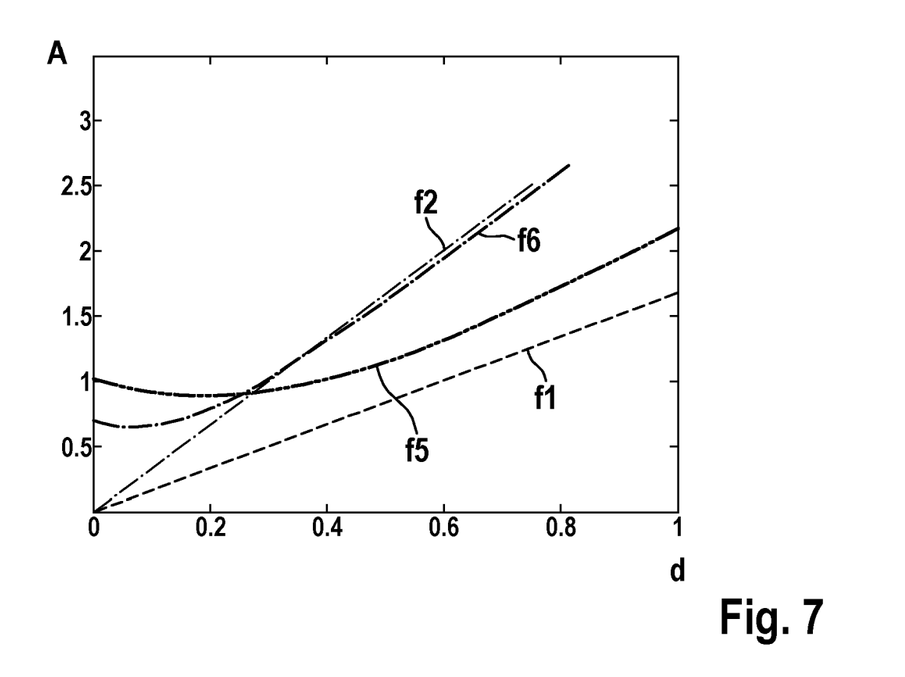
FIG. 7 shows a schematic illustration of the divergence with regard to the slow axis for red light, given the use of a light-emitting device according to the present invention.
Figure 8:
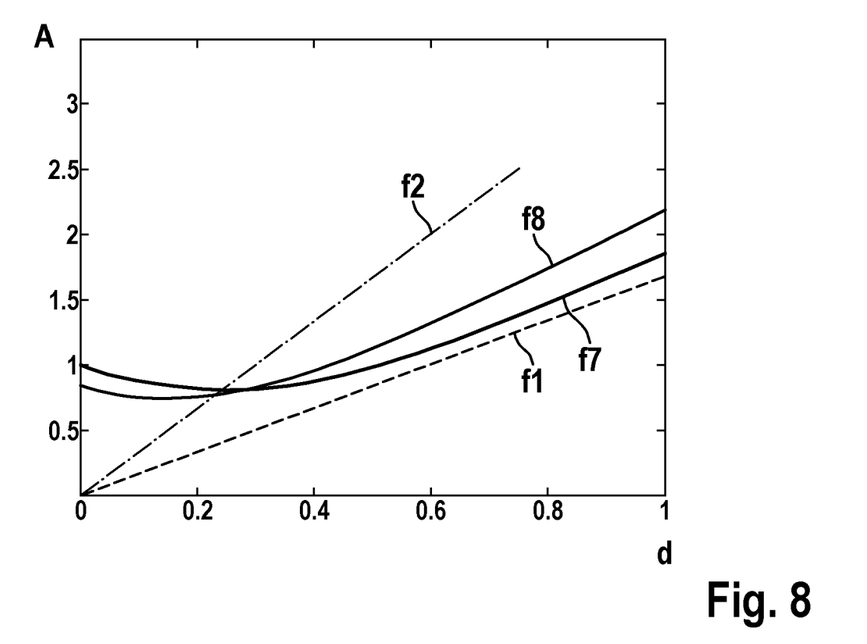
FIG. 8 shows a schematic illustration of the divergence with regard to the fast axis for green light, given the use of a light-emitting device according to the present invention.
Figure 9:
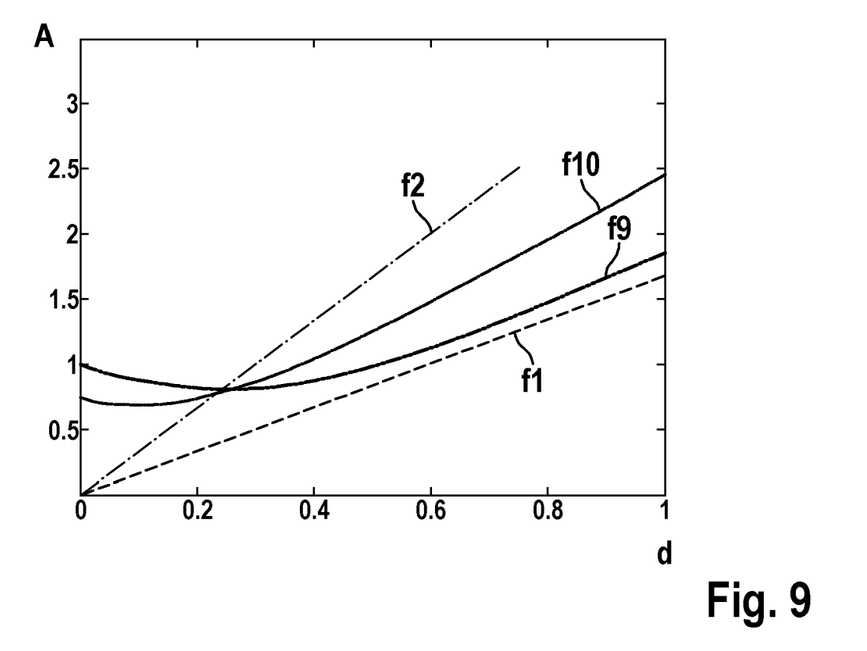
FIG. 9 shows a schematic illustration of the divergence with regard to the slow axis for green light, given the use of a light-emitting device according to the present invention.

FIG. 6 illustrates the divergence with regard to the major axis, or fast axis, for red light, FIG. 7 illustrates the divergence with regard to the minor axis, or slow axis, for red light, FIG. 8 illustrates the divergence with regard to the major axis, or fast axis, for green light, and FIG. 9 illustrates the divergence with regard to the minor axis, or slow axis, for green light, in each case given the use of a light-emitting device 100 to 300 according to the present invention. A third function f3, fifth function f5, seventh function f7, and ninth function f9 each correspond to a maximum divergence angle, and a fourth function f4, sixth function f6, eighth function f8, and tenth function f10 each correspond to a minimum divergence angle, the maximum and minimum divergence angles resulting from tolerances in the manufacturing of the laser diodes. As can be seen in FIGS. 6 to 9, for sufficiently large distances d, third to tenth functions f3 to f10 all run within the range specified by first function f1 and by second function f2. Thus, with a single setting for all wavelength ranges, good resolution with adequate intensity can be ensured.

If the ellipticities were not adapted before the combining to form an overall light beam, in general this would not be possible. In this case, through suitable selection of a further beamforming device for correcting an ellipticity of the overall light beam, it would be possible to bring it about that the corresponding divergence, in a desired range of distances d (for picoprojectors, typically between 0.5 and 2 meters) lies within the range specified by first function f1 and by second function f2; however, this cannot be simultaneously ensured for all wavelength ranges. The same holds for the use of a circular aperture as further beamforming device without preceding adaptation of the ellipticities of the beam cross-sections of the laser light beams, whereby the light intensity is strongly reduced and additional noise effects are generated. The preceding adaptation of the ellipticities of the beam cross-sections of the laser light beams thus results in a significant improvement of light intensity and resolution.

Figure 10:
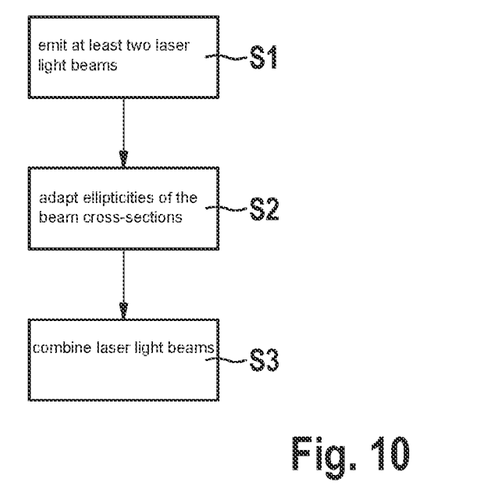
FIG. 10 shows a flow diagram of a method for emitting light according to a specific embodiment of the present invention.

FIG. 10 shows a flow diagram of a method for emitting light. In a first method step S1, at least two laser light beams are emitted, ellipticities of beam cross-sections of the laser light beams differing at least partly from one another.

In a subsequent method step S2, the ellipticities of the beam cross-sections are adapted to a common ellipticity.

In a method step S3, after the adapting of the ellipticities of the beam cross-sections, the laser light beams are combined by the beamforming device to form an overall light beam. The overall light beam is subsequently emitted. Optionally, the overall light beam can also be deflected by at least one micromirror.

The method can be carried out using one of the above-described light-emitting devices 100 to 300.

What is claimed is:

1. A light-emitting device, comprising:
 a laser light device configured to emit a multiplicity of laser light beams, ellipticities of beam cross-sections of the laser light beams differing at least partly from one another;
 a beamforming device in the beam path of at least one of the laser light beams and configured to adapt the ellipticities of the beam cross-sections of the laser light beams to one another by adapting a major axis and a minor axis of the beam cross-section of the at least one laser light beam to one another;
 a beam-combining device configured to combine the laser light beams to form an overall light beam, after the adapting of the ellipticities of the beam cross-sections by the beamforming device; and
 a further beamforming device situated in the beam path of the overall light beam, wherein the further beamforming device has at least one cylinder lens and/or a cylinder telescope, wherein the major axis of the elliptical beam cross-section of a laser light beam of the multiplicity of laser light beams, or of the overall light beam, is configured to be adapted to the minor axis.

2. The light-emitting device as recited in claim 1, wherein the beamforming device has at least one cylinder lens introduced into a beam path of one of the laser beams, and/or a cylinder telescope, that is configured to reduce the ellipticity of the beam cross-section of the one of the laser light beams.

3. The light-emitting device as recited in claim 1, wherein the beamforming device is configured to adapt the ellipticities in such a way that the ellipticities of the beam cross-sections of the laser light beams have the same value after the adapting.

4. The light-emitting device as recited in claim 1, wherein the beamforming device is configured to adapt the ellipticities of the beam cross-sections of the laser light beams to the ellipticity of the beam cross-section of one of the laser light beams.

5. The light-emitting device as recited in claim 1, wherein the laser light device includes a multiplicity of laser light sources that are configured to emit laser light beams having wavelengths that are at least partly different from one another.

6. The light-emitting device as recited in claim 1, wherein the beam-combining device includes wavelength-selective mirrors for combining the laser light beams to form a common light beam.

7. A light-emitting device, comprising:
 a laser light device configured to emit a multiplicity of laser light beams, ellipticities of beam cross-sections of the laser light beams differing at least partly from one another;
 a beamforming device in the beam path of at least one of the laser light beams and configured to adapt the ellipticities of the beam cross-sections of the laser light beams to one another by adapting a major axis and a minor axis of the beam cross-section of the at least one laser light beam to one another;
 a beam-combining device configured to combine the laser light beams to form an overall light beam, after the adapting of the ellipticities of the beam cross-sections by the beamforming device; and
 a further beamforming device situated in the beam path of the overall light beam and that is designed to correct an ellipticity of a cross-section of the overall light beam.

8. The light-emitting device as recited in claim 7, wherein the further beamforming device has a prism telescope for correcting the ellipticity of the overall light beam.

9. A light-emitting device, comprising:
 a laser light device configured to emit a multiplicity of laser light beams, ellipticities of beam cross-sections of the laser light beams differing at least partly from one another;
 a beamforming device in the beam path of at least one of the laser light beams and configured to adapt the ellipticities of the beam cross-sections of the laser light beams to one another by adapting a major axis and a minor axis of the beam cross-section of the at least one laser light beam to one another; and a beam-combining device configured to combine the laser light beams to form an overall light beam, after the adapting of the ellipticities of the beam cross-sections by the beamforming device, wherein the beamforming device is configured to adapt the ellipticities in such a way that the ellipticities of the beam cross-sections of the laser light beams each lie in a specified range between 1.5 and 2.5, after the adapting.

* * * * *